US006260371B1

(12) United States Patent
Moraes et al.

(10) Patent No.: US 6,260,371 B1
(45) Date of Patent: Jul. 17, 2001

(54) MOUNTING OF A CONTROL BOX IN AN ELECTRICAL APPLIANCE

(75) Inventors: Luciano da Luz Moraes, Canoas; Paulo Augusto Lisboa Ramos, Esteio, both of (BR)

(73) Assignee: Carrier Corporation, Syracuse, NY (US)

( * ) Notice: Subject to any disclaimer, the term of this patent is extended or adjusted under 35 U.S.C. 154(b) by 0 days.

(21) Appl. No.: 09/554,051

(22) PCT Filed: Sep. 16, 1998

(86) PCT No.: PCT/BR98/00073

§ 371 Date: May 9, 2000

§ 102(e) Date: May 9, 2000

(87) PCT Pub. No.: WO00/16598

PCT Pub. Date: Mar. 23, 2000

(51) Int. Cl.[7] .................................................... F25D 23/12
(52) U.S. Cl. ................................. 62/262; 62/298; 439/545
(58) Field of Search ............................ 62/262, 298, 263, 62/259.1; 174/50, 58, 50.54; 248/229.12; 439/545, 574

(56) References Cited

U.S. PATENT DOCUMENTS

| 4,019,570 | * | 4/1977 | Siegel . | |
|---|---|---|---|---|
| 4,447,030 | * | 5/1984 | Nattel . | |
| 4,645,089 | * | 2/1987 | Horsley . | |
| 5,010,742 | * | 4/1991 | Bolton et al. . | |
| 5,532,435 | | 7/1996 | Bolton et al. | 174/135 |
| 5,755,593 | | 5/1998 | Pepe | 439/557 |
| 6,009,717 | * | 1/2000 | Hernandez et al. . | |

FOREIGN PATENT DOCUMENTS

| 298 09 098 U | 8/1998 | (DE) . |
|---|---|---|
| 03261121 | 11/1991 | (JP) . |

\* cited by examiner

*Primary Examiner*—William Doerrler
*Assistant Examiner*—Chen-Wen Jiang

(57) ABSTRACT

An electric appliance in a control box mounted within the appliance. The appliance has a planar support wall, which includes first and second mounting rails carried by the support wall. Each of the mounting rails includes an L-shaped structure having a first leg attached to the wall and a second leg supported by the first leg in spaced parallel relationship with the wall. The free edges of the first and second mounting rails are configured to face one another in parallel spaced relationship with one another. The control box is provided with a planar mounting wall, which has a first rail engaging structure formed thereon which is configured to be slidingly received in the space between the second leg of the first mounting rail and the planar support wall. The planar mounting wall includes a second rail engaging structure, which is configured to be slidingly received in the space between the second leg of the second mounting rail and the support wall.

5 Claims, 8 Drawing Sheets

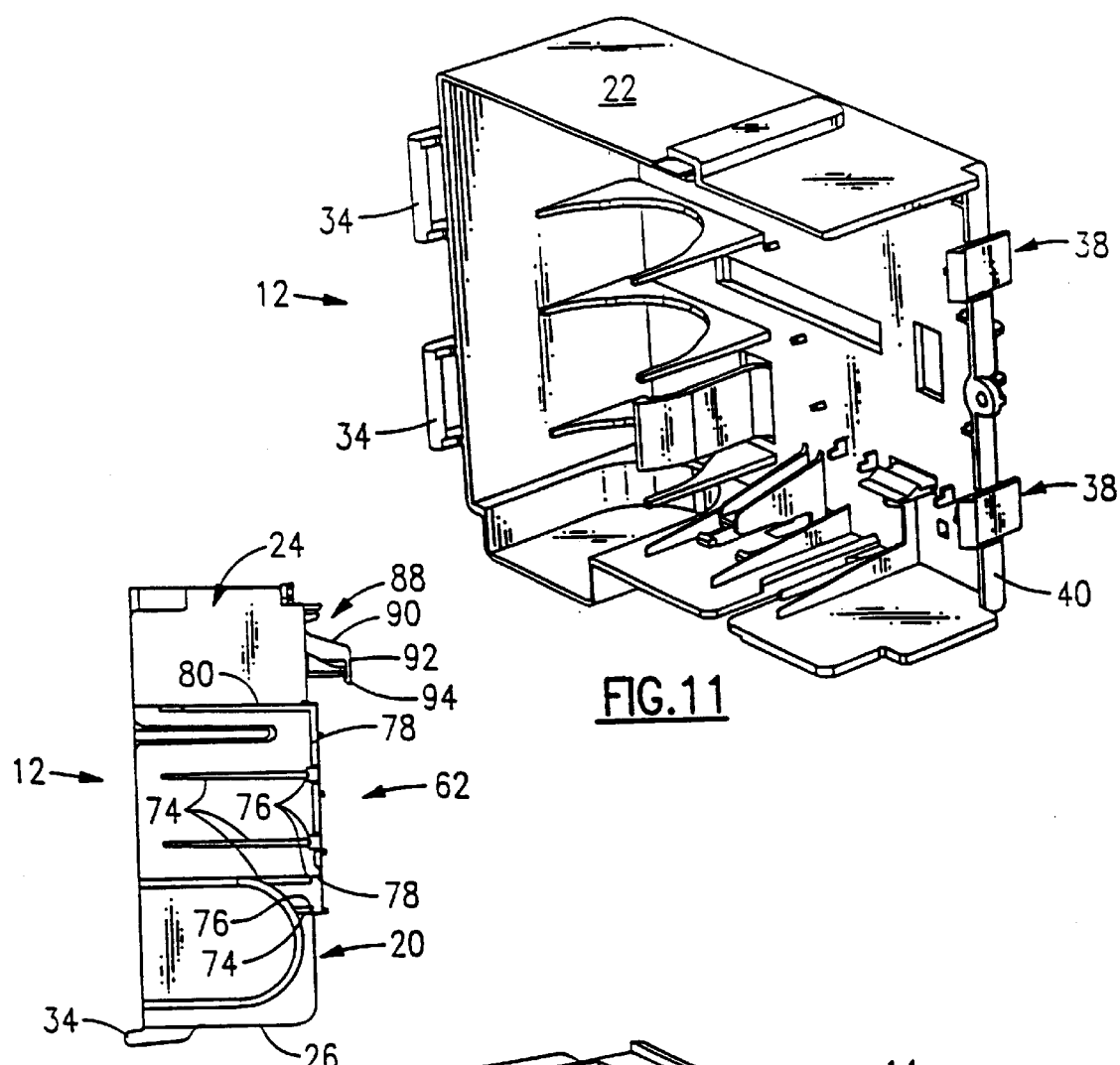
FIG.11
FIG.12
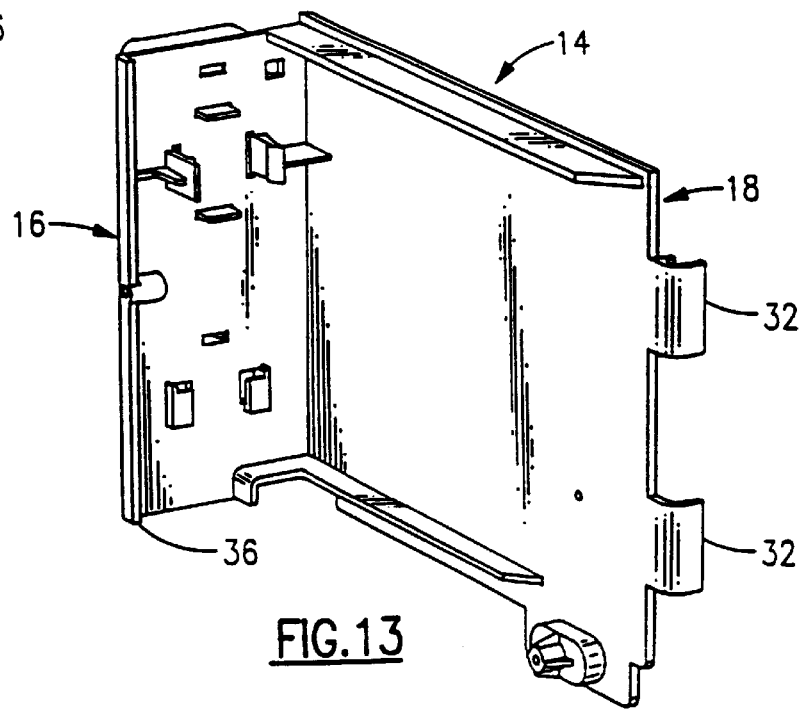
FIG.13

MOUNTING OF A CONTROL BOX IN AN ELECTRICAL APPLIANCE

TECHNICAL FIELD

This invention relates to control boxes for electrical appliances and more specifically, to the mounting of a control box within such an appliance.

BACKGROUND ART

Most electrical appliances are provided with self-contained electrical control boxes. Such control boxes typically include control switches such as on/off switches, function switches, thermostats, etc. Power cords for such appliances usually pass into the, control box where appropriate electrical connections are made to the various control components and electrical wiring distributing control signals and power to various power utilizing components of the appliance pass from the control box. Control boxes are known, which are made from sheet metal components as well as molded plastic components. Regardless of the type of structure, a control box must be supported and adequately attached to appropriate structural components of the appliance in which it is used Such support and attaching hardware quite often is overly complex and adds cost for both materials and labor to the appliance. It is accordingly deemed desirable to have an electrical control box which is easily installed and removed from an electrical appliance.

DISCLOSURE OF THE INVENTION

An electric appliance in a control box mounted within the appliance. The appliance has a planar support wall, which includes first and second mounting rails carried by the support wall. Each of the mounting rails includes an L-shaped structure having a first leg attached to the wall and a second leg supported by the first leg in spaced parallel relationship with the wall. The free edges of the first and second mounting rails are configured to face one another in parallel spaced relationship with one another. The control box is provided with a planar mounting wall, which has a first rail engaging structure formed thereon which is configured to be slidingly received in the space between the second leg of the first mounting rail and the planar support wall. The planar mounting wall includes a second rail engaging structure, which is configured to be slidingly received in the space between the second tee of the second mounting rail and the support wall.

BRIEF DESCRIPTION OF THE DRAWINGS

The invention may be better understood and its objects and advantages will become apparent to those skilled in the art by reference to the accompanying drawings, in which:

FIG. 11 is a perspective of the interior of the main body of the control box as viewed from the left front side thereof;

FIG. 12 is a bottom plan view of the control box; and

FIG. 13 is a perspective view taken from the back side of the interior of the cover of the control box.

BEST MODE FOR CARRYING OUT THE INVENTION AND INDUSTRIAL APPLICABILITY

Figure 1:
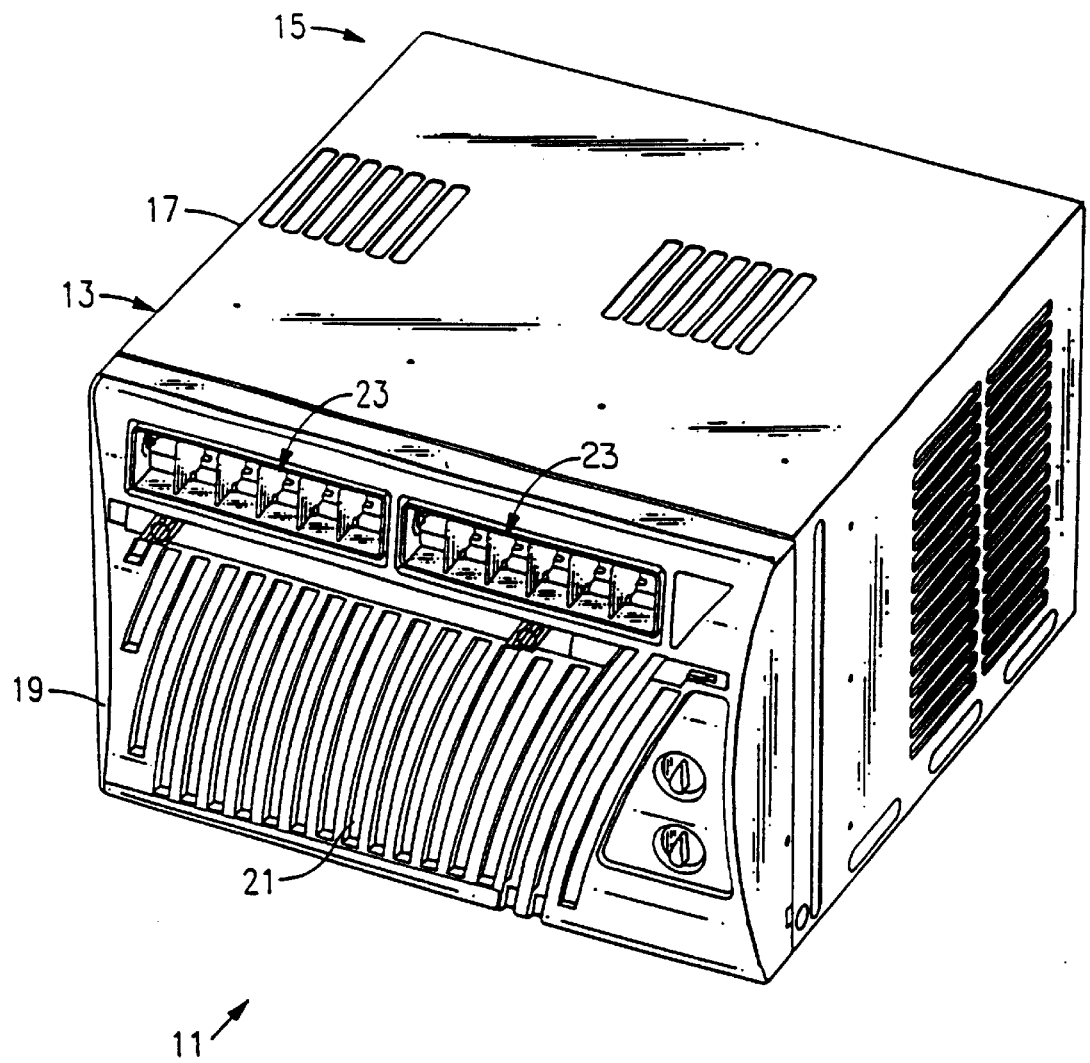
FIG. 1 is a perspective view taken from the right front side of an air conditioning unit in which a control box according to the present invention may be installed.

FIG. 1 illustrates a room air conditioner unit 11 which includes, generally, an indoor section 13 and outdoor section 15. The room air conditioner is enclosed in a substantially rectangular housing 17 and is adapted to be positioned in a rectangular opening in an exterior or in a window in a room where cooling is desired, with the indoor section 13 facing into the room, as is conventional. The indoor section 13 includes an indoor grille section 19, which includes inlet louvers 21 and a pair of air discharge assemblies 23.

Figure 2:
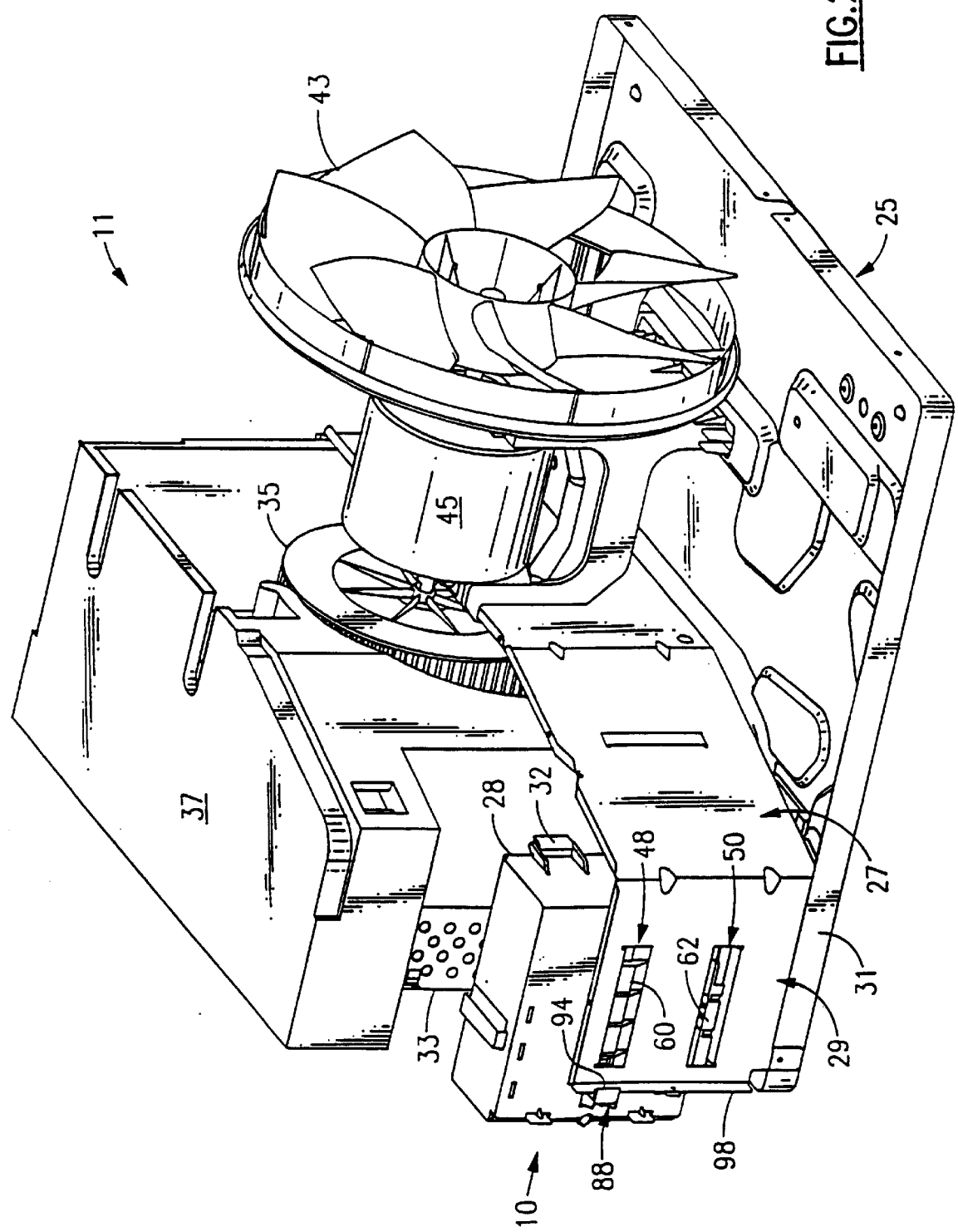
FIG. 2 is a rear perspective view of the air conditioning unit of FIG. 1 with the outer cover removed therefrom showing the control box of the present invention installed therein.
Figure 5:
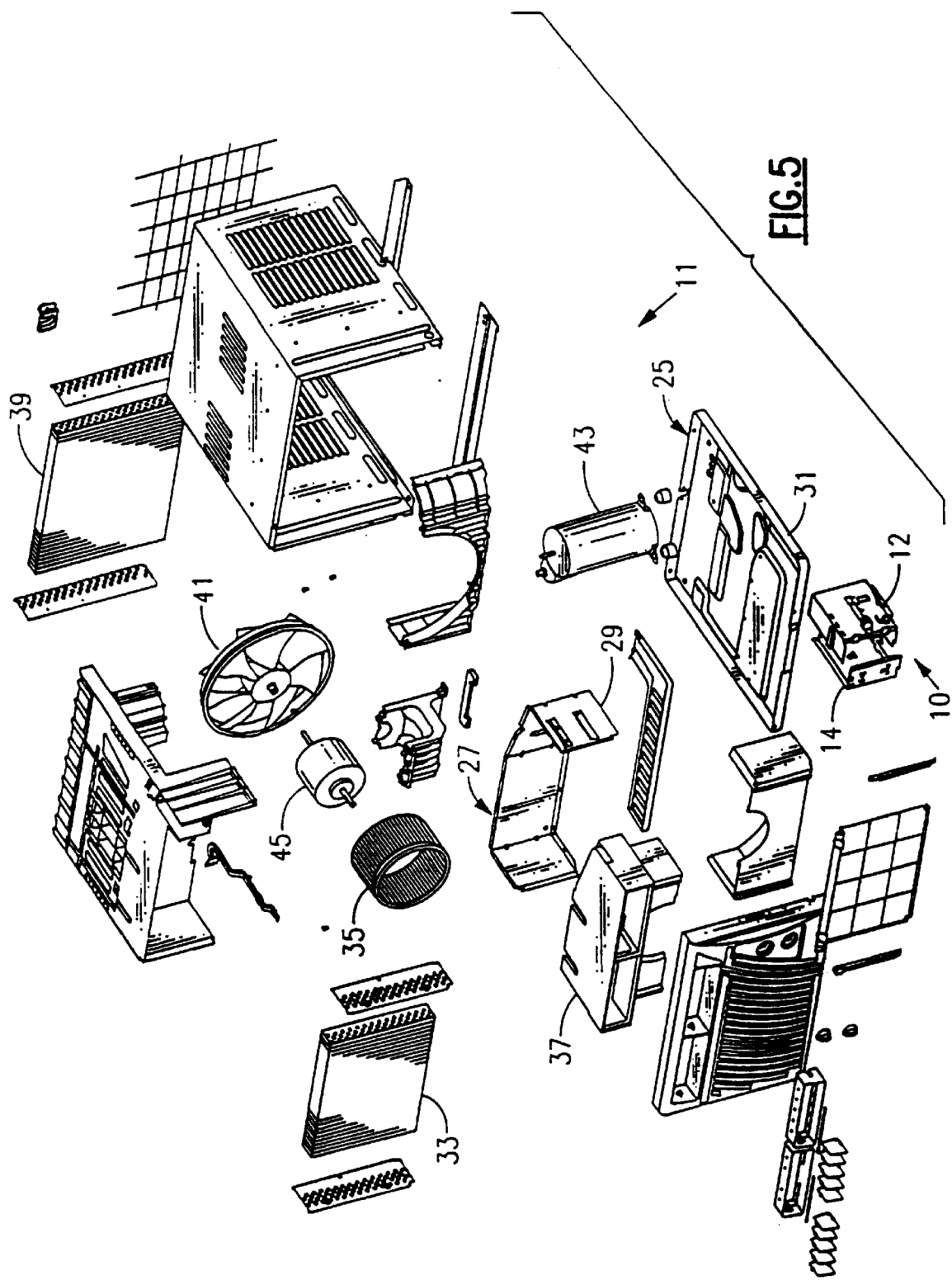
FIG. 5 is an exploded view of the air conditioning unit illustrated in FIG. 1.
Figure 6:
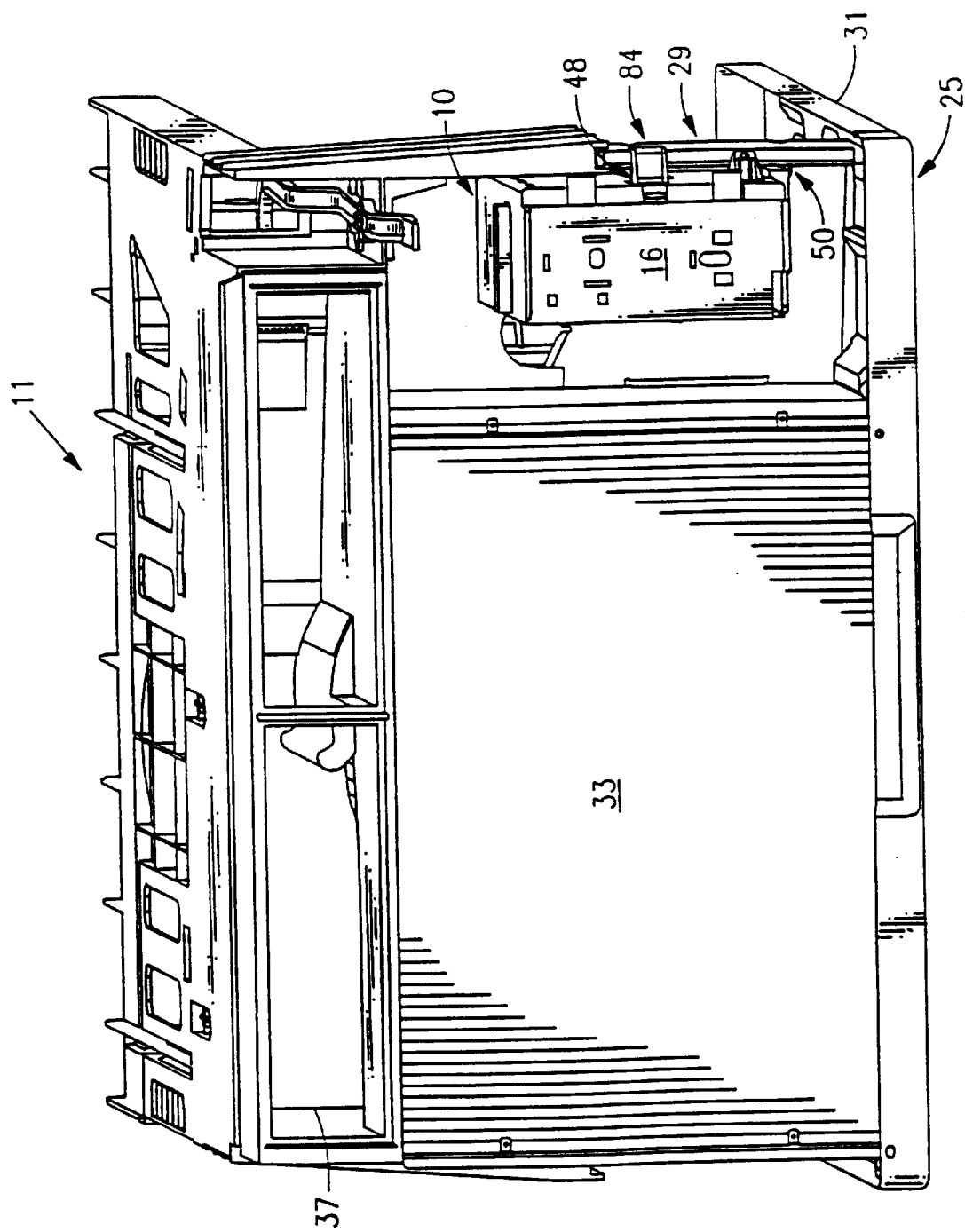
FIG. 6 is a front view of the air conditioning unit of FIG. 1 with the front grille and outer cover removed to show the control box installed.

Looking now at FIGS. 2, 5 and 6, the components of both the indoor section 13 and outdoor section 15 are supported in a rectangular basepan 25. The indoor and outdoor sections are separated by a vertically extending metal partition, of which, the lower port 27 thereof is illustrated assembled to the basepan in FIG. 2. As is seen in FIGS. 2 and 5, the metal partition 27 is made up of several interconnected planar sections and has a right-hand wall section 29 extending vertically upwardly from the basepan 25 and parallel to the right side wall 31 of the basepan. As will be seen, the vertical wall section 29 of the partition serves as the structural mounting for the control box 10 of the present invention.

For purposes of understanding the environment in which the present invention is utilized, other essential components of the air conditioning unit in which it is used will be briefly described. The indoor section 13 of the unit includes basically an evaporator coil 33, an evaporator fan 35 located behind the evaporator and an air directing scroll 37. The outdoor section 15 includes a condenser coil 39, a condenser fan 41 and a compressor 43. An electric motor 45 has front and rear drive shafts which are interconnected to the evaporator fan and the condenser fan such that both fans are commonly driven by the motor. The evaporator coil 33, the condenser coil 39 and the compressor 43 are interconnected to form a refrigeration circuit, as is conventional, and which operate in conjunction with the evaporator and condenser fans to provide cooling to the room in which the unit is installed, as is conventional.

The control box 10 of the present invention is, configured to be installed within the indoor section of the air conditioning unit 11 structurally attached to the wall section 29 of the metal partition 27.

Figure 7:
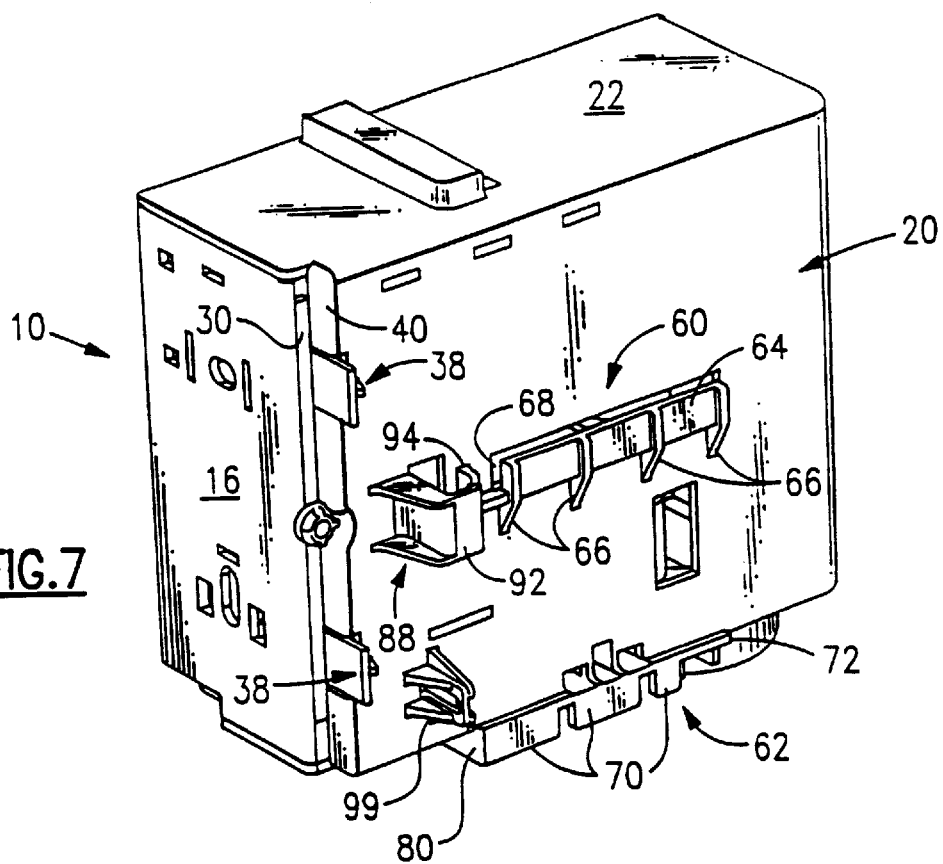
FIG. 7 is a perspective of the control box from the front right side thereof.

FIGS. 7–13 illustrate the electrical - control box 10, which includes a main body section 12 and a cover 14. Both the body and the cover are single piece components molded from a suitable structural plastic material such as polystyrene or the like. The control box 10 is a substantially rectangular shaped structure with the cover section 14, as best seen in FIG. 13, defining the front wall 16 and the left side wall 18 thereof It should be understood that the terms left and right, front and back, and top and bottom are used with reference to the control box as illustrated in FIG. 7.

Figure 9:
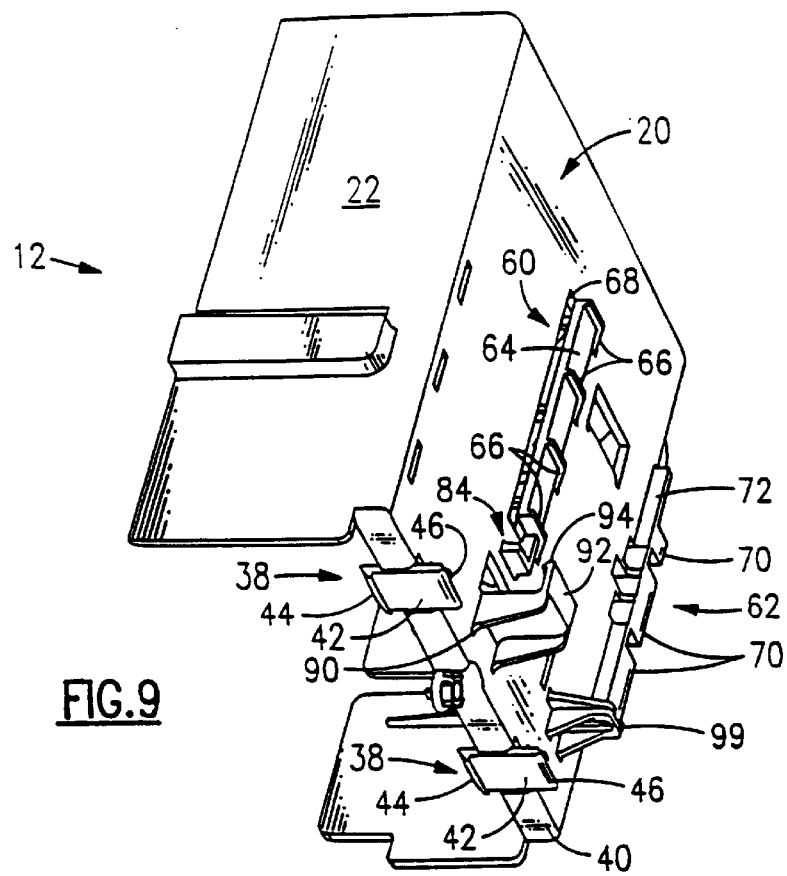
FIG. 9 is a perspective view of the main body of the control box from the top right side thereof.
Figure 10:
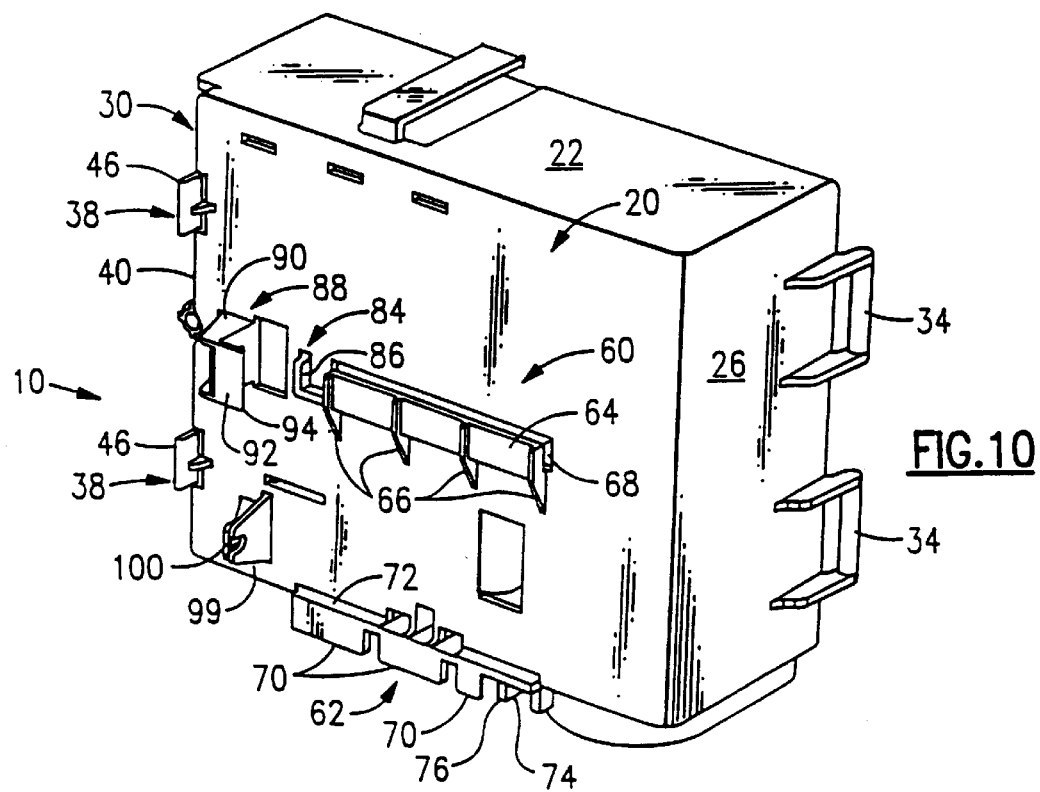
FIG. 10 is a perspective of the main body portion of the control box as viewed from the right rear thereof.

The main body 12 thus defines the right side wall 20, the top 22, the bottom 24 and the back wall 26. The main body 12 and the cover 14 are attached to one another by a hinged connection at the left rear corner 28 thereof and a releasable latching connection at the right front corner 30 thereof. The hinge connection 28 includes two hook-shaped outwardly extending hinges 32 formed at the back of the left side wall 18 of the cover 14, and a pair of hinge pins 34 configured to receive the hinge elements 32 formed on the left side of the back wall 26 of the main body 12. The latching interconnection 30 includes an inwardly extending lip 36 formed on the right side of the front wall 16 of the cover 14 and two flexible latches 38 formed at the front edge 40 of the right side wall 20 of the main body 12. As best seen in FIGS. 9 and 11, the latches 38 each comprise a rectangular flex section 42, which is fixed to the front edge 40 at approximately the midpoint thereof. The flex sections carry at the left-hand end thereof a triangular latch head 44 adapted to flex rearwardly to move into engagement with the lip 36 on the cover 14 and to be flexed out of engagement with said lip by forward motion of a free-standing right-hand end 46 of the flex section 42.

Figure 3:
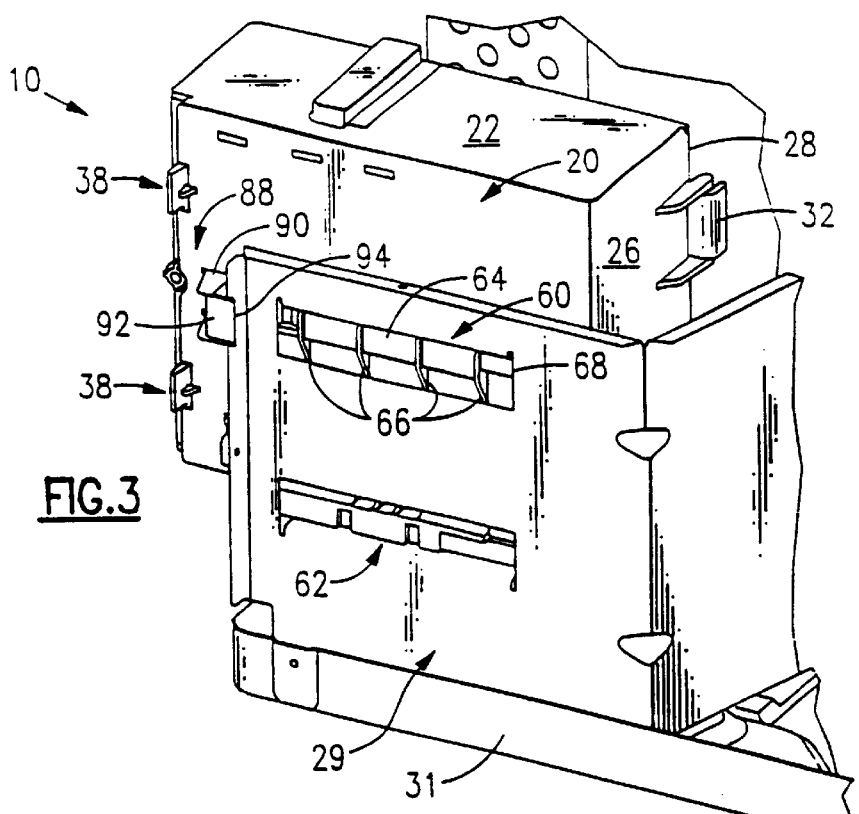
FIG. 3 is an enlarged view of the control box installation as shown in FIG. 2.
Figure 4:
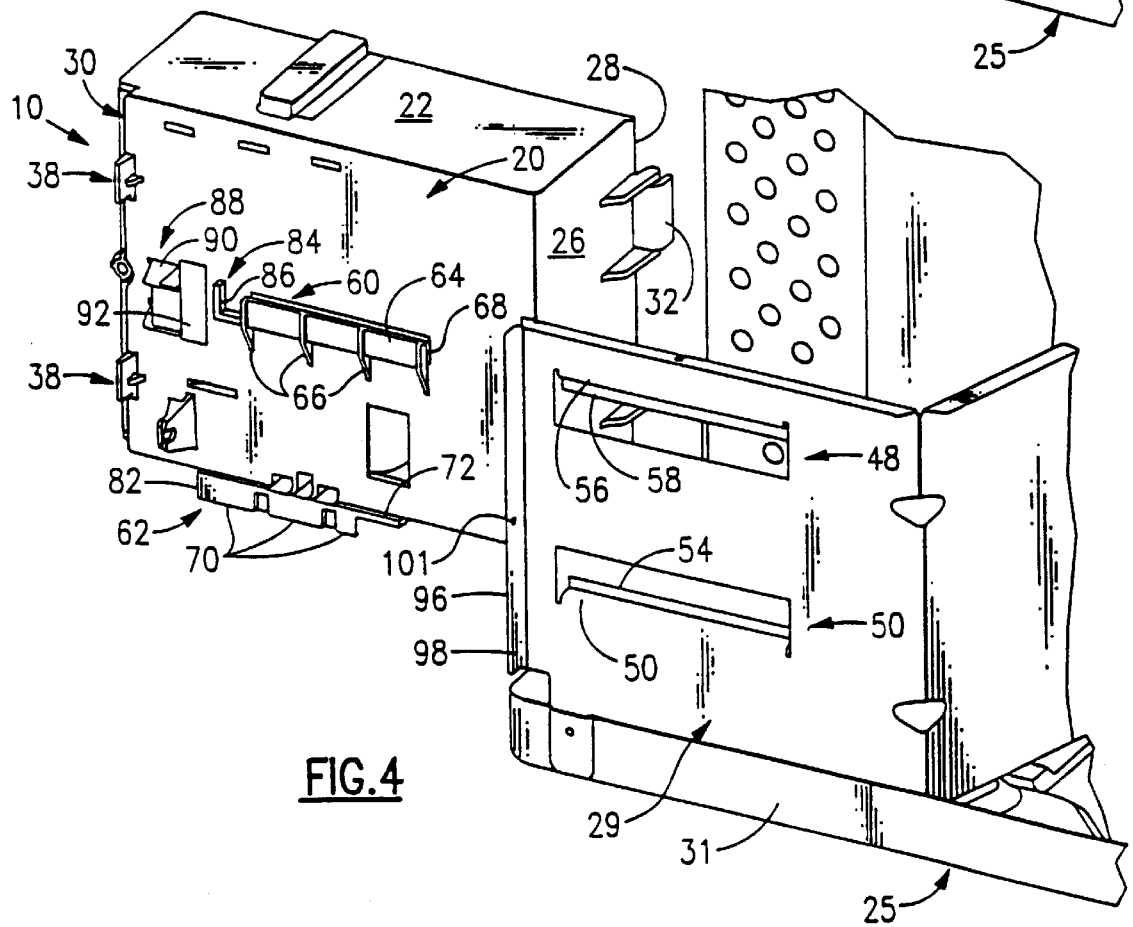
FIG. 4 is a view similar to FIG. 3 with the control box positioned just prior to installation.

The vertically extending control box mounting wall 29 is fabricated from a sheet steel material and, as best shown in FIGS. 3 and 4, has an upper mounting rail 48 and a lower mounting rail 50 formed therein. The lower mounting rail 50 is an elongated L-shaped structural having a horizontal leg 52 integrally formed with the wall 29 and extending to the left of the wall as illustrated in FIG. 6. The other leg of the L-shaped section comprises a vertically upwardly extending wall section 54. The upper mounting rail 48 is defined by an inverted L-shaped structure having a horizontal section 56 similar to that of the lower mounting rail and a downwardly vertically extending wall section 58. The vertical wall sections 54 and 58 extend in a common plane which is spaced from the plane defined by the side wall 29.

Extending outwardly and upwardly from the right side wall 20 of the control box is upper control box mounting structure 60, which is adapted to be received in sliding relationship with the upper mounting rail structure 48. Also extending downwardly and outwardly from the side wall 20 and the bottom wall 24 of the control box 10 is lower control box mounting structure 62, which is adapted to be received in sliding relationship with the lower mounting rail structure 50.

The upper control box mounting structure 60 comprises an elongated rectangular wall 64 supported in spaced relationship from the right side wall 20 by four support elements 66 integrally molded into the side wall. The space 68 behind the elongated wall 64 and the right side wall 20 is of a dimension to receive a vertically extending wall section 54 of the upper mounting rail 48 therein.

Figure 8:
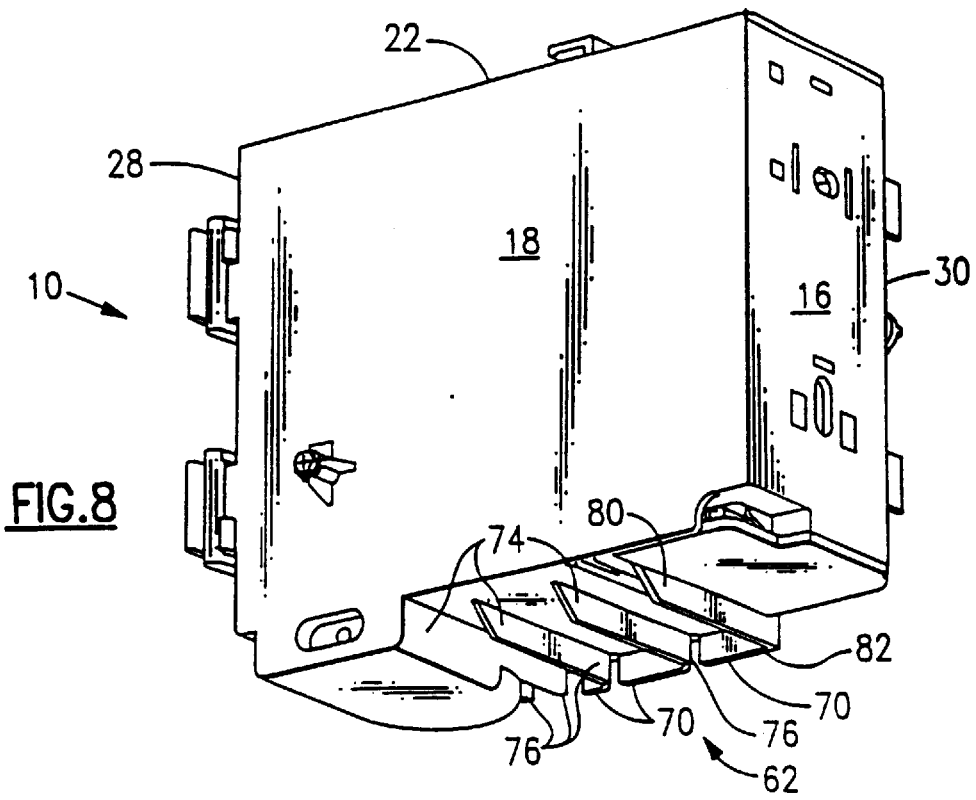
FIG. 8 is a perspective view of the control box as viewed from the lower left side thereof.

The lower control box mounting structure 62 is defined by three unequal length, spaced vertically extending wall segments 70, which are further supported by a horizontal extension 72, from side, wall 20, such that the three wall segments are supported in the same plane as the rectangular wall 64 of the upper support structure 60. As is best seen in FIGS. 8 and 12, the bottom wall 24 has integrally molded therein five parallel, spaced wall sections which extend perpendicular to the three wall segments 70. Four of the wall sections 74 have free ends 76, which are spaced from the back sides of the three wall segments 70 by a distance defining a space 78 the same width as the space 76 formed by the upper mounting structure. The fifth parallel wall 80 intersects with the end of the forward most of the three segments 70 to define a stop 82 for the vertical portion 58 of the lower mounting rail 50 when the control box is installed. It should be noted that the upper control box mounting structure 60 also includes a stop 84 defined by an L-shaped protrusion 86 from the side wall 20 forwardly of the elongated rectangular wall section 64. The stops 82 and 84 are vertically aligned with one another to assure positive positioning of the control box when installed.

It will be appreciated from the description above that the control box 10 is easily installed to the metal partition wail 29 by positioning the control box as illustrated in FIG. 4 and simply sliding the control box into the position illustrated in FIG. 3 with the mating structure of the control box and the partition 29 cooperating with one another as described above. As installed, the positioning of the control box will be determined by engagement of the upper and lower mounting rails 48 and 50 with their respective stop elements 82 and 84.

To assure retention of the control box in this position, a flexible latch 88 extends from the right side wall 20 of the control box forwardly of the upper mounting structure 60. The latch includes a structural wall 90 extending outwardly from the right side wall, which terminates in a flexible latch section 92 which extends substantially parallel to and spaced from the side wall 20, and a latching head 94 formed at the end of the flexible latch section 92. As is best seen in FIG. 3, the latch 88 is configured such that the latch head 94 will engage a flange 96 formed at the front edge of the metal partition wall 29. The flange extends parallel to the wall and is configured to engage the latch head 94 and deflect it outwardly as the control box is being installed. When the latch head passes behind the flange and is in positive engagement with the back side 98 of the flange 96 it returns to its undeflected position. Removal of the control box for service 92, replacement or the like, may be readily accomplished by deflecting the flexible section 92 of the latch outwardly to disengage the latch head 94 and thereby slide the control box out of its installed position.

In the event that the flexible latch should break during the lifetime of the unit, a structural protrusion 99 extends from the side wall 20 underlying the latch 92. The structural wall 99 is adapted to be positioned in confronting relationship with the flange 96 when the control box is in its installed position. The wall 99 and has a through opening 100 therein, which is in axial alignment with an opening 101 in the flange 96 and, accordingly, a suitable threaded fastener may pass through these openings to attach the control box to the flange 96.

What is claimed is:

1. An electric appliance and a control box mounted within the appliance, the appliance having a planar support wall therein wherein the improvement comprises:

a first mounting rail carried by said planar support wall, said first mounting rail comprising an elongated L-shaped structure having a first leg attached to and extending away from said wall, and a second leg supported by said first leg in spaced substantially parallel relationship with said support wall and having a free edge facing in a first direction;

a second mounting rail carried by said planar support wail, said second mounting rail comprising an elongated L-shaped structure having a first leg attached to and extending away from said wall, and a second leg supported by said first leg in spaced substantially parallel relationship with said mounting wall and having a free edge facing, and substantially parallel to said free edge of said fast mounting rail;

said control box having a substantially planar mounting wall, said mounting wall having, a first rail engaging structure formed thereon which is configured to be slidingly received in said space between said second leg of said first mounting rail and said support wall; and said mounting wall having a second rail engaging structure formed thereon which is configured to be slidingly received in said space between said second leg of said second mounting rail and said support wall.

2. The apparatus of claim 1 wherein said planar support wall is made from sheet metal and control box is made from a molded plastic material.

3. The apparatus of claim 1 wherein said planar mounting wall has a flexible latch extending outwardly therefrom; and wherein said planar support wall has a latch receiving structure thereon, said flexible latch being configured to become engaged with said latch receiving structure when said control box is slid into its installed position with respect to said first and second mounting rails.

4. The apparatus of claim 1 wherein said appliance is a room air conditioner.

5. The apparatus of claim 4 wherein said room air conditioner comprises a partition dividing said air conditioner into indoor and outdoor sections, wherein said planar support wall comprises a part of said partition.

* * * * *